(12) United States Patent
Li et al.

(10) Patent No.: US 8,884,288 B1
(45) Date of Patent: Nov. 11, 2014

(54) SEMICONDUCTOR STRUCTURE WITH MEANS FOR TESTING METAL-INSULATOR-METAL CAPACITORS

(71) Applicant: Shanghai Huali Microelectronics Corporation, Shanghai (CN)

(72) Inventors: Qiang Li, Shanghai (CN); Zhuanlan Sun, Shanghai (CN); Changhui Yang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 14/040,741

(22) Filed: Sep. 30, 2013

(30) Foreign Application Priority Data

Jul. 23, 2013   (CN) .......................... 2013 1 0312455

(51) Int. Cl.

| | |
|---|---|
| H01L 23/58 | (2006.01) |
| H01L 29/10 | (2006.01) |
| H01L 27/108 | (2006.01) |
| H01L 29/94 | (2006.01) |
| H01L 23/48 | (2006.01) |
| H01L 23/52 | (2006.01) |
| H01L 29/40 | (2006.01) |
| H01L 21/02 | (2006.01) |
| H01L 21/20 | (2006.01) |
| H01L 21/4763 | (2006.01) |
| H01L 21/302 | (2006.01) |
| H01L 21/461 | (2006.01) |
| H01L 21/8242 | (2006.01) |
| H01L 21/8234 | (2006.01) |
| H01L 21/8244 | (2006.01) |
| H01L 21/00 | (2006.01) |
| H01L 21/66 | (2006.01) |
| H01L 49/02 | (2006.01) |

(52) U.S. Cl.
CPC ................ *H01L 22/30* (2013.01); *H01L 28/40* (2013.01); *Y10S 438/957* (2013.01); *Y10S 438/959* (2013.01)
USPC ...... 257/48; 257/303; 257/306; 257/E21.008; 257/E21.009; 257/E21.579; 257/758; 257/759; 257/301; 257/532; 438/957; 438/396; 438/397; 438/622; 438/637; 438/638; 438/723; 438/724; 438/687; 438/959; 438/250; 438/393; 438/381; 438/3; 438/238

(58) Field of Classification Search
USPC ............ 257/48, 303, 306, E21.008, E21.009, 257/E21.579, 758, 759, 301, 532; 438/957, 438/622, 637, 638, 723, 724, 687, 959, 438/250–256, 393–399, 381, 3, 238–241
See application file for complete search history.

(56) References Cited

U.S. PATENT DOCUMENTS 6,836,399 B2 * 12/2004 Lee et al. .................... 361/306.1
6,995,071 B2 *  2/2006 Oh et al. ....................... 438/396

(Continued)

*Primary Examiner* — Evan Pert
*Assistant Examiner* — Gustavo Ramallo

(57) ABSTRACT

The present invention provides a semiconductor structure for testing MIM capacitors. The semiconductor structure comprises: a first metal layer comprising at least a first circuit area and a second circuit area; a second metal layer located below the first metal layer with a first dielectric layer lying therebetween and connected with the second circuit area; a top plate located within the first dielectric layer closer to the first metal layer and connected with the first circuit area; a bottom plate located within the first dielectric layer closer to the second metal layer and separated from the top plate with an insulation layer therebetween and connected with the second circuit area. The second metal layer is connected with the substrate through a first electric pathway so as to form a second electric pathway from the top plate to the substrate when an electric leakage region exists in the insulation layer.

8 Claims, 1 Drawing Sheet

(56) References Cited

U.S. PATENT DOCUMENTS

| | | | | |
|---|---|---|---|---|
| 7,038,280 B2 | * | 5/2006 | Righter | 257/355 |
| 7,170,090 B1 | * | 1/2007 | Chaparala et al. | 257/48 |
| 7,211,495 B2 | * | 5/2007 | Park | 438/386 |
| 7,238,628 B2 | * | 7/2007 | Demaray et al. | 438/785 |
| 7,390,682 B2 | * | 6/2008 | Chaparala et al. | 438/18 |
| 8,350,311 B2 | * | 1/2013 | Kaneko et al. | 257/301 |
| 8,487,406 B2 | * | 7/2013 | Darabi et al. | 257/532 |
| 8,530,949 B2 | * | 9/2013 | Onuma et al. | 257/314 |
| 2003/0001188 A1 | * | 1/2003 | Nakagawa | 257/303 |
| 2009/0001514 A1 | * | 1/2009 | Bae | 257/532 |
| 2013/0069199 A1 | * | 3/2013 | Adkisson et al. | 257/532 |

* cited by examiner

SEMICONDUCTOR STRUCTURE WITH MEANS FOR TESTING METAL-INSULATOR-METAL CAPACITORS

CROSS-REFERENCE TO RELATED APPLICATION

This application claims the priority benefit of China application serial no. 201310312455.2, filed Jul. 23, 2013. All disclosure of the China application is incorporated herein by reference.

FIELD OF THE INVENTION

The present invention relates to the field of semiconductor fabrication technology and particularly to a semiconductor structure for testing Metal-Insulator-Metal capacitors.

BACKGROUND OF THE INVENTION

Metal-Insulator-Metal (MIM) capacitors are capacitor structures formed between the interconnection layers of semiconductor devices. The Metal-Insulator-Metal capacitors are massively applied in CMOS devices such as RFICs (Radio-Frequency Integrated Circuits) and semiconductor memories due to the satisfying compatibility with the back-end-of-line (BEOL) processing during the semiconductor manufacturing.

Taken a MIM capacitor structure defined by 2 masks as an example, it comprises from top to bottom a first metal layer, a dielectric layer, a top plate, an insulation layer, a bottom plate, a dielectric layer and a second metal layer. The top plate and bottom plate can be led out to form the positive and negative poles through vertical via interconnections or BEOL line.

Considering that processing problems or defects during the MIM capacitor preparation process may cause breakdown or current leakage of the MIM capacitor, an effective measurement should be taken to determine whether an electric leakage exists in the MIM capacitor.

A semiconductor structure for testing a MIM capacitor in the prior art is provided. As shown in FIG. 1, in the semiconductor structure, a first metal layer 110 is configured to be an upper layer of the structure, comprising a first circuit area 1100 and a second circuit area 1101. A second metal layer 111 is located right below the first metal layer 110, and separated from the first metal layer 110 by a dielectric layer 112 located therebetween. A top plate 120 and a bottom plate 121 are oppositely disposed within the dielectric layer 112 without contacting the first metal layer 110 and the second metal layer 111 respectively. The top plate 120 is separated from the bottom plate 121 by an insulation layer 122 located therebetween. The first circuit area 1100 is connected with the top plate 120 through a circuit connection 130, for example a vertical via interconnection or BEOL line, and the second circuit area 1101 is connected with the bottom plate 121 through a circuit connection 131 as well. The first metal layer 110 and the second metal layer 111, together with the insulation layer 122, form a MIM capacitor.

On one hand, since the conventional MIM capacitor is enclosed within insulating medium, the electric leakage regions existing in the insulating medium between the top plate and bottom plate is difficult to be detected through a voltage contrast mode due to the lack of a leakage path formed straight to the substrate. Therefore, it is hard to position the electric leakage regions in the MIM capacitor especially in large-size MIM capacitor.

On the other hand, by adopting a method of successively removing the layers covering the top plate of the MIM capacitor and then scanning the top plate in voltage contrast mode, unusual images representing obvious electric leakage regions can be observed. But for a slight electric leakage, it doesn't work well.

Thus, there is a need to design a semiconductor structure for detecting the electric leakage regions in a MIM capacitor completely and accurately.

SUMMARY OF THE INVENTION

Accordingly, at least one object of the present invention is to provide a semiconductor structure for testing MIM capacitor capable of completely and accurately detecting the electric leakage regions in the MIM capacitor.

In order to achieve the above object, a semiconductor structure with multi-layers for testing Metal-Insulator-Metal capacitor is provided, comprising:

a first metal layer comprising at least a first circuit area and a second circuit area; a second metal layer located below the first metal layer with a first dielectric layer lying therebetween, and connected with the second circuit area;

a top plate located within the first dielectric layer closer to the first metal layer, and connected with the first circuit area; a bottom plate located within the first dielectric layer closer to the second metal layer and separated from the top plate by an insulation layer lying therebetween, and connected with the second circuit area; wherein, the semiconductor structure is formed on a P-type substrate; the second metal layer is connected with the substrate through a first electric pathway so as to form a second electric pathway which comprises the first electric pathway from the top plate to the substrate when an electric leakage region exists in the insulation layer.

Preferably, the semiconductor structure further comprises a third metal layer which is apart from the second metal layer with a second dielectric layer and apart from the substrate with a third dielectric layer, the third metal layer is electrically connected with the second metal layer and the substrate respectively to form the first electric pathway.

Preferably, the third metal layer is respectively connected with the second metal layer and the substrate through vertical via interconnections.

Preferably, the top plate comprises multiple plate regions arranged apart from each other, each plate region is electrically connected with the first circuit area.

Preferably, the top plate comprises 8 plate regions, with 4 plate regions evenly distributed along the length direction and 2 plate regions evenly distributed along the width direction, each plate region is uniform in size and shaped as a rectangular.

In the semiconductor structure of the present invention for testing MIM capacitor, a leakage path from the top plate straight to the substrate is formed when an electric leakage region exists in the insulation layer of the MIM capacitor, and thus the electric leakage region, however small, can be completely and accurately detected in the voltage contrast mode. The semiconductor structure is simple in preparation and low in cost. It promotes the efficiency of the failure analysis for the MIM capacitors, and it is especially suitable for quick positioning of the electric leakage regions in a large-size MIM capacitor.

BRIEF DESCRIPTION OF THE DRAWINGS

The accompanying drawings are included to provide a further understanding of the advantages and principles of the invention, in which.

DETAILED DESCRIPTION OF THE EMBODIMENTS

Figure 1:
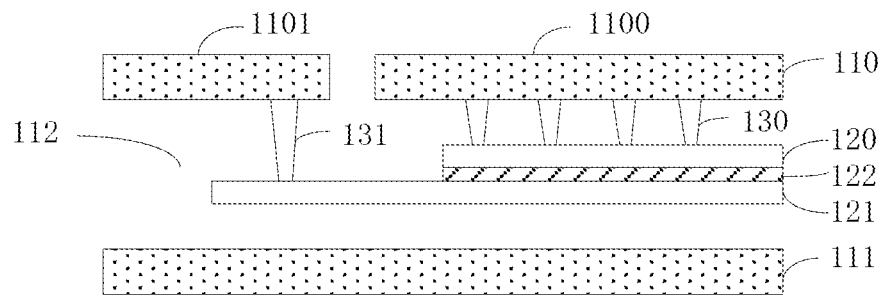
FIG. 1 shows an a semiconductor structure for testing MIM capacitor in the prior art.

The method of manufacturing dual gate oxide devices of the present invention will be described in further details hereinafter with respect to the embodiments and the accompanying drawings.

The present invention is described with reference to the attached figures, wherein like reference numerals are used throughout the figures to designate similar or equivalent elements. The figures are not drawn to scale and they are provided merely to illustrate the invention.

Figure 2:
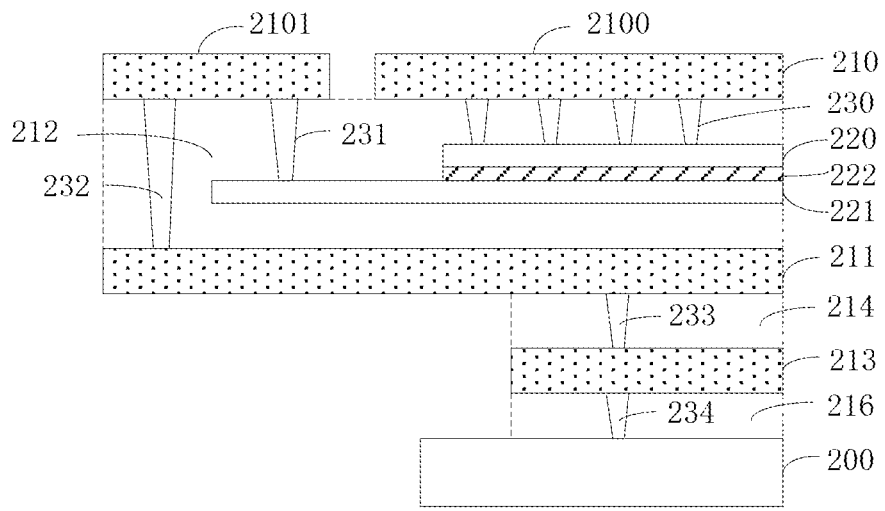
FIG. 2 shows an a semiconductor structure for testing MIM capacitor according to one embodiment of the present invention.

According to one embodiment of the present invention, a semiconductor structure for testing a MIM capacitor is supplied, comprising: a first metal layer 210, a second metal layer 211, a top plate 220 and a bottom plate 221. As shown in FIG. 2, the first metal layer 210 is configured to be the surface of the structure or an inside layer of the structure, which comprises at least a first circuit area 2100 and a second circuit area 2101. The second metal layer 211 is located right below the first metal layer 210, and separated from the first metal layer 210 by a first dielectric layer 212 located therebetween. Part of the second metal layer 211 is connected with the second circuit area 2101. The top plate 220 is located within the first dielectric layer 212 closer to the first metal layer 210 than to the second metal layer 211 and is connected with the first circuit area 2100. The bottom plate 221, which is located oppositely to the top plate 220 within the first dielectric layer 212 closer to the second metal layer 211, is separated from the top plate 220 by an insulation layer 222 disposed therebetween. The bottom plate 221 is also connected with the second circuit area 2101. The first metal layer 210, the second metal layer 211 together with the insulation layer 222 form a MIM capacitor.

The semiconductor structure is formed on a P-type substrate. The second metal layer 211 is connected with the substrate through a first electric pathway, so that a second electric pathway which comprises the first electric pathway is formed when electric leakage regions exist in the insulation layer 222.

The material of the first dielectric layer 212 includes but not limited to $SiO_2$.

In an embodiment of the invention, the semiconductor structure further comprises a third metal layer 213 which is electrically connected with the second metal layer 211 and is separated therefrom by a second dielectric layer 214 located therebetween. Additionally, the third metal layer 213 is electrically connected with the P-type substrate and is separated therefrom by a third dielectric layer 216 located between them. In this way, the first electric pathway, beginning from the second metal layer 211 and ending at the P-type substrate 200, is formed.

More specifically, the first circuit area 2100 is electrically connected with the top plate 200 through at least one circuit connection 230, such as the BEOL lines. The second circuit area 2101 is electrically connected with the bottom plate 221 and the second metal layer 211 through at least one circuit connection 231 and at least one circuit connection 232 respectively. The circuit connections 230,231,232 may be BEOL lines or vertical via interconnections.

Similarly, the third metal layer 213 is electrically connected with the second metal layer 211 and the P-type substrate 200 through circuit connections 233, 234 respectively.

When electric leakage regions exist in the insulation layer 222 of the MIM capacitor, the second electric pathway beginning from the top plate 220 and ending at the substrate 200 is formed. The second electric pathway comprises the following branches: a first branch from the top plate 220 to the bottom plate 221 through the insulation layer 222, a second branch from the bottom plate 221 to the second metal layer 211 through the second circuit area 2101, and a third branch from the second metal layer 211 to the P-type substrate 200 which is defined as the first electric pathway mentioned above.

When the MIM capacitor is tested, any of the electric leakage regions, including tiny leakages, can be detected completely and accurately in the voltage contrast mode through the second electric pathway. Furthermore, the semiconductor structure is simple in preparation and low in cost.

It is noted that the semiconductor structure is only illustrated in a three-metal-layer form for convenience. In fact, a group of metal layers, even more than 10 metal layers, can be employed in the semiconductor structure when possible. Any one of the metal layers can be defined as the top plate or the bottom plate. Any semiconductor structure which comprises a leakage path beginning from the top plate and ending at the substrate can be used to test the MIM capacitors when electric leakage regions exist and should fall within the scope of the invention.

In the embodiment, the first electric pathway beginning from the second metal layer 211 and ending at the substrate 200 is formed by passing through the third metal layer 213 utilizing the vertical via interconnection, which is not limited thereto. In practice, in order to achieve the purpose of the invention, any form of electric connections, including but not limited to the BEOL lines or vertical via interconnections, can be used for connecting the top plate 220 with the substrate 200 to form the second pathway when the electric leakage regions exist in the MIM capacitor.

Figure 3:
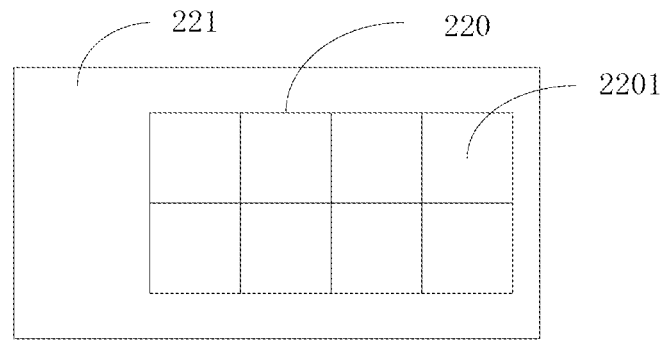
FIG. 3 shows the top and bottom plates of the semiconductor structure for testing MIM capacitor according to one embodiment of the present invention.

In another embodiment of the invention, the bottom plate 221 is formed in an integral plate, while the top plate 220 comprises multiple plate regions 2201 which are arranged apart from each other, as shown in FIG. 3. Each plate region 2201 is electrically connected with the first circuit area 2100. In this way, each plate region 2201 is respectively led to the substrate 200 when electric leakage regions exist. Therefore the MIM capacitor can be considered to be composed of many small capacitors paralleled with each other. When an electric leakage region exists in the insulation layer 222, the corresponding plate region 2201 thereof can be determined in the voltage contrast mode.

More specifically, the top plate 220 comprises 8 plate regions, with 4 plate regions evenly distributed along the length direction and 2 plate regions evenly distributed along the width direction, each plate region 2201 is uniform in size and shaped as a rectangular. The top plate and bottom plate are oppositely and parallel disposed with each other, with the area of the bottom plate 221 larger than that of the top plate 220. The top plate 220 and bottom plate 221 can be made from TiN or TaN.

Since the top plate 220 comprises multiple plate regions 2201, different electric leakage regions of the MIM capacitor can be simultaneously detected in the voltage contrast mode, which promotes the efficiency of the failure analysis for the MIM capacitor. The semiconductor structure of the invention is especially suitable for quick and accurate positioning of the electric leakage regions in a large-size MIM capacitor.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A semiconductor structure with multi-layers for testing a Metal-Insulator-Metal capacitor, comprising:
 a first metal layer comprising at least a first circuit area and a second circuit area;
 a second metal layer located below the first metal layer with a first dielectric layer lying therebetween, and connected with the second circuit area;
 a top plate located within the first dielectric layer closer to the first metal layer, and connected with the first circuit area;
 a bottom plate located within the first dielectric layer closer to the second metal layer and separated from the top plate by an insulation layer lying therebetween, and connected with the second circuit area;
 wherein, the semiconductor structure is formed on a P-type substrate; the second metal layer is connected with the substrate through a first electric pathway so as to form a second electric pathway which comprises the first electric pathway from the top plate to the substrate when an electric leakage region exists in the insulation layer.

2. The semiconductor structure according to claim 1, wherein the semiconductor structure further comprises a third metal layer which is apart from the second metal layer with a second dielectric layer and apart from the substrate with a third dielectric layer, the third metal layer is electrically connected with the third metal layer and the substrate respectively to form the first electric pathway.

3. The semiconductor structure according to claim 2, wherein the third metal layer is respectively connected with the second metal layer and the substrate through vertical via interconnections.

4. The semiconductor structure according to claim 3, wherein the top plate comprises multiple plate regions arranged apart from each other, each plate region is electrically connected with the first circuit area.

5. The semiconductor structure according to claim 4, wherein the top plate comprises 8 plate regions, with 4 plate regions evenly distributed along the length direction and 2 plate regions evenly distributed along the width direction, each plate region is uniform in size and shaped as a rectangular.

6. The semiconductor structure according to claim 1, wherein the top plate and the bottom plate are oppositely and parallel disposed with each other; the area of the bottom plate larger than that of the top plate.

7. The semiconductor structure according to claim 1, wherein the top plate and the bottom plate are made from TiN or TaN.

8. The semiconductor structure according to claim 1, wherein the first dielectric layer is made from $SiO_2$.

* * * * *